United States Patent
Chen et al.

(10) Patent No.: US 7,858,990 B2
(45) Date of Patent: Dec. 28, 2010

(54) DEVICE AND PROCESS OF FORMING DEVICE WITH PRE-PATTERNED TRENCH AND GRAPHENE-BASED DEVICE STRUCTURE FORMED THEREIN

(75) Inventors: An Chen, Sunnyvale, CA (US); Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 298 days.

(21) Appl. No.: 12/201,851

(22) Filed: Aug. 29, 2008

(65) Prior Publication Data
US 2010/0051960 A1     Mar. 4, 2010

(51) Int. Cl.
*H01L 29/15*     (2006.01)
(52) U.S. Cl. .......... 257/76; 257/E29.082; 257/E21.051; 438/105
(58) Field of Classification Search ............ 257/76, 257/E29.082, E21.051; 438/105
See application file for complete search history.

(56) References Cited

U.S. PATENT DOCUMENTS 7,732,859 B2 *   6/2010   Anderson et al. .......... 257/328

2009/0169919 A1 *   7/2009   Garcia et al. .......... 428/688

OTHER PUBLICATIONS

Claire Berger, Zhimin Song, Tianbo Li, Xuebin Li, Asmerom Y. Ogbazghi, Rui Feng, Zhenting Dai, Alexei N. Marchenkov, Edward H. Conrad, Phillip N. First, and Walt A. De Heer; "Ultrathin Epitaxial Graphite: 2D Electron Gas Properties and a Route toward Graphene-based Nanoelectronics"; *J. Phys. Chem. B* 2004, 108, pp. 19912-19916.

K. S. Novoselov, et al.; "Electric Field Effect in Atomically Thin Carbon Films"; Science 306, pp. 666-609 (2004); DOI: 10.1126/science.1102896; Oct. 22, 2004 vol. 306 Science.

Scott Gilje, Song Han, Minsheng Wang, Kang L. Wang, and Richard B. Kaner; "A Chemical Route to Graphene for Device Applications"; Nano Letters, 2007, vol. 7 No. 11, pp. 3394-3398.

* cited by examiner

*Primary Examiner*—Trung Dang
(74) *Attorney, Agent, or Firm*—Ditthavong, Mori & Steiner, P.C.

(57) ABSTRACT

A graphene-based device is formed with a trench in one or more layers of material, a graphene layer within the trench, and a device structure on the graphene layer and within the trench. Fabrication techniques includes forming a trench defined by one or more layers of material, forming a graphene layer within the trench, and forming a device structure on the graphene layer and within the trench.

20 Claims, 7 Drawing Sheets

DEVICE AND PROCESS OF FORMING DEVICE WITH PRE-PATTERNED TRENCH AND GRAPHENE-BASED DEVICE STRUCTURE FORMED THEREIN

BACKGROUND OF THE INVENTION

1. Field of the Invention

The present invention relates to the formation of graphene-based devices.

2. Discussion of the Background

Graphene is a flat monolayer of carbon atoms tightly packed into a two-dimensional honeycomb lattice that resembles chicken wire. It is the building block for graphite material. Graphene has attracted great attention for electronic applications due to its extremely high mobility (e.g., over 200,000 $cm^2/V \cdot s$) and some unique properties (e.g., bandgap modulation by structure). However, the fabrication methods for graphene devices are still quite rudimentary.

Graphene has some unique material properties that make it very attractive for electronic applications. Its mobility has been demonstrated to be over 200,000 $cm^2/V \cdot s$ in experiments. Unlike the high mobility in some un-doped bulk semiconductors, graphene mobility remains high even at high carrier concentration. Carrier transport in graphene can be ballistic on the micrometer scale at room temperature. Similar to carbon nanotubes, graphene has ambipolar electric field effect, i.e., it can be electrically doped to become n-type or p-type depending on the gate voltage. The badgap of semiconducting graphene can be modulated by its structure, e.g., the width of a graphene stripe. Graphene also has superior thermal conductivity that can enable some on-chip thermal management functions. As a natural two-dimensional system with planar form, graphene is easier to pattern than carbon nanotubes. Also, graphene can be potentially made with very low cost.

The first few-layer graphene was prepared by mechanical exfoliation of highly-oriented graphite. (See, e.g., K. S. Novoselov, et al, "Electric Field Effect in Atomically Thin Carbon Films", Science 306, 666 (2004).) Even a graphene monolayer can be prepared with this method; however, such a method is unsuitable for production. Another method of growing graphene is the thermal decomposition of SiC where Si atoms are removed and C atoms left behind form graphene-like structures in the surface layers. (See, e.g., C. Berger, et al., "Ultrathin Epitaxial Graphite: 2D Electron Gas Properties and a Route toward Graphene-based Nanoelectronics", J. Phys. Chem. B 108, 19912 (2004).) A drawback of this method is the high temperature (~1400° C.) in this process. More methods are being developed including chemical synthesis. (See, e.g., S. Gilje, et al., "A Chemical Route to Graphene for Device Applications", Nano Lett. 7, 3394 (2007).) It is expected that some low-temperature material preparation methods suitable for production will be developed for graphene.

Current device fabrication methods all start with the preparation of a graphene layer followed by the patterning of device structures. For example, FIG. 5 depicts a graphene-based field effect transistor (FET) structure, which is fabricated and structured according to a related art process. Such a related art process for fabricating graphene devices includes providing a substrate 110 and then first growing or depositing a graphene layer on the substrate 110. Then, the process includes patterning the device structures by etching the graphene layer to form graphene 112, and depositing source and drain regions 114, a gate dielectric 116 and a gate metal 118. The process is limited by the difficulty of handling of the graphene layer. Since graphene has to be made extremely small to exhibit some unique physical properties, the patterning and etching of graphene into extremely small sizes presents a challenge using current fabrication methods.

Thus, a need exists for a process for forming graphene-based devices that simplifies the fabrication process of such devices and provide better process control.

SUMMARY OF THE INVENTION

The present invention advantageously provides embodiments of a process that includes forming a trench defined by one or more layers of material, forming a graphene layer within the trench, and forming a device structure on the graphene layer and within the trench.

The present invention further advantageously provides embodiments of a graphene-based device that includes a trench formed in one or more layers of material, a graphene layer formed within the trench, and a device structure formed on the graphene layer and within the trench.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF EMBODIMENTS OF THE INVENTION

Figure 1A:
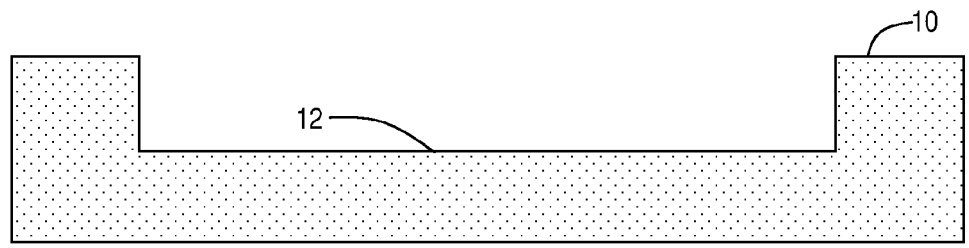
FIGS. 1A-1E depict a process of formation of a graphene-based field effect transistor (FET) structure, which is fabricated and structured according to an embodiment of the present invention.

Embodiments of the present invention will be described hereinafter with reference to the accompanying drawings. In the following description, the constituent elements having substantially the same function and arrangement are denoted by the same reference numerals, and repetitive descriptions will be made only when necessary.

Embodiments of the present invention utilize pre-patterned trench structures for the growth of graphene. Thus, such trench structures can be used to define the device dimensions and structures. Such a process simplifies the fabrication process and avoids the etching of the graphene layer. Such a process also allows better process control and improves reliability. The process also enables device dimensions and structures that are difficult or impossible to achieve with current graphene device fabrication methods.

The processes disclosed herein can be used on a variety of device structures, for example, n-type or p-type field effect transistors, bipolar devices, p-n junctions, etc. The processes disclosed herein can be used to form various types of electrical devices or other devices, and the devices can include materials that may or may not be considered semiconductor materials.

FIGS. 1A-1E depict a process of formation of a graphene-based field effect transistor (FET) structure, which is fabricated and structured according to an embodiment of the present invention. The process involves first patterning and etching trench structures in order to define the device size and shape of the structure, and then followed by the formation of the graphene layer. The process depicted in FIGS. 1A-1E utilizes thermal decomposition of a graphene precursor (e.g., SiC) as the graphene growth method.

In the process step shown in FIG. 1A, a trench 12 is etched in a substrate material containing carbon or graphene precursor 10 (e.g., SiC). The shape and dimensions (i.e., depths, widths, lengths) of the trench is determined based upon the device structures being formed within the trench. Regarding depth dimensions, while currently depths on the order of 200 to 400 microns can be sufficient, in the future depths as shallow as 50 to 100 nanometers may be possible and more desirable.

Figure 1B:
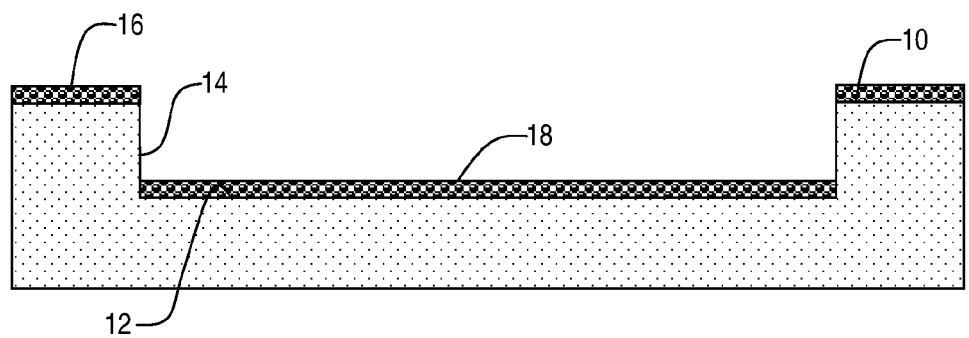

In the process step shown in FIG. 1B, a graphene layer is grown by thermal decomposition of the graphene precursor 10. By selecting a surface orientation of (0, 0, 0, 1), the graphene layer will form generally only on non-vertical surfaces of the graphene precursor, and not on sidewalls 14 of the trench 12. Thus, as can be seen in FIG. 1B, the graphene layer formed in this step will include a first portion 16 formed on the upper surface of the graphene precursor 10 outside of the trench 12, and a second portion 18 formed on a bottom surface of the trench 12.

Figure 1C:
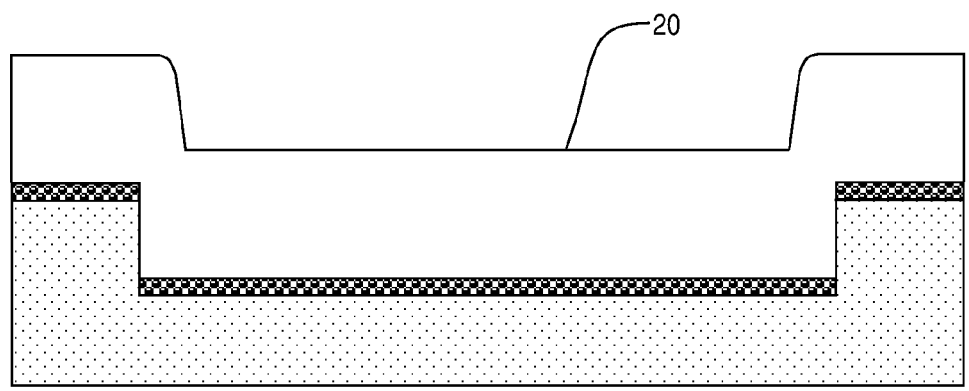
Figure 1D:
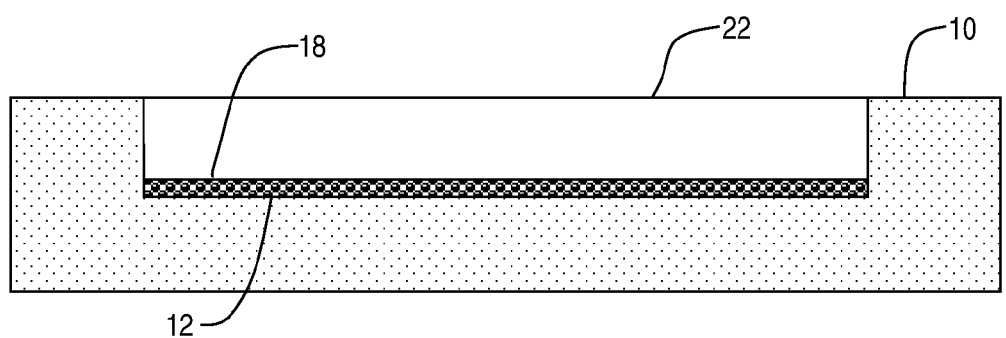

In the process step shown in FIG. 1C, a dielectric material 20 (e.g., a high-k insulator) is deposited. And, in the process step shown in FIG. 1D, a chemical mechanical polish (CMP) is performed to polish the upper surface of the device structure, thus removing the dielectric material outside of the trench 12, as well as the first portion 16 of the graphene layer outside of the trench 12. As a result, a dielectric layer 22 remains within the trench 12 above the remaining graphene layer 18.

Figure 1E:
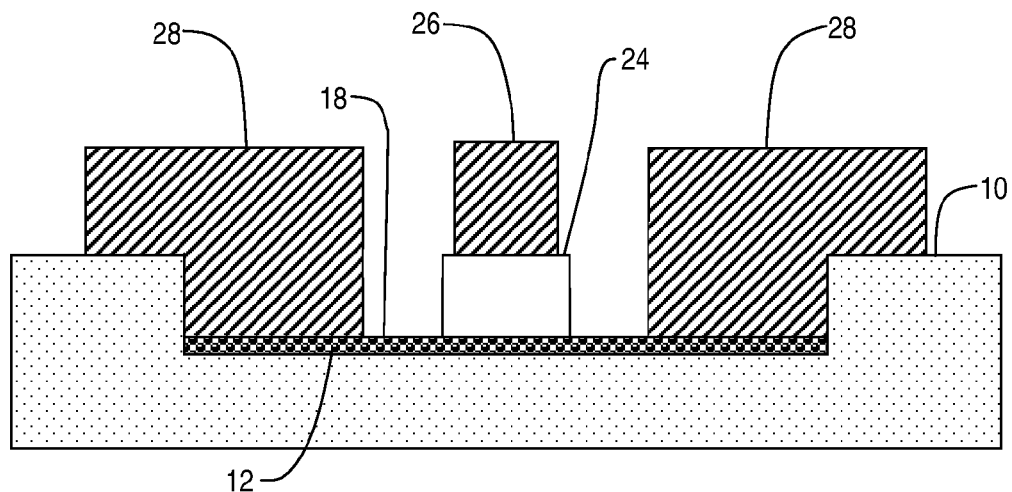

In the process step shown in FIG. 1E, the dielectric layer remaining in the trench 12 is patterned to form gate dielectric 24, and a metal contact 26 for a gate is deposited and patterned thereon within the trench 12. Additionally, metal contacts 28 for source and drains regions are deposited and patterned on the graphene layer 18 within the trench 12. Thus, source/drain metal contacts and a gate metal contact are formed upon the graphene layer 18 within the trench 12 to form a graphene-based device structure, which in this instance is a graphene-based FET. A protective insulator cap can be deposited to cover and protect the entire device structure.

In the graphene-based field effect transistor shown in FIG. 1E, it is not necessary to add dopant to the graphene layer. It is possible to use one trench per device structure, and/or more than one device structure per trench where the plural device structures within each trench are isolated/separated by dielectric material. Also, in a plural device configuration, where the devices are provided in either a common trench or in separate trenches, the graphene layer can be initially formed over the entire trench and then patterned for each device to form graphene layers for each device, and/or graphene layers can be initially formed over individual trenches with the graphene layers in the trenches thus being in isolation from one another.

FIGS. 1A-1E only depict one implementation and the process described with respect thereto can be altered, while maintaining the basic idea of fabricating graphene device(s) in a pre-patterned trench structure(s). For example, regarding the process step depicted in FIG. 1E, spacers can be used to define the metal contacts.

Figure 2A:
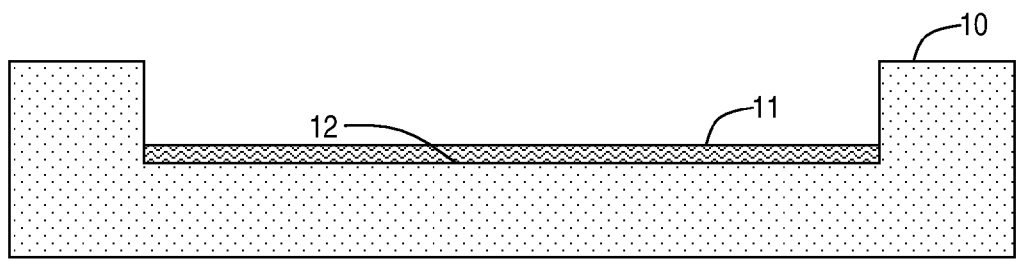
FIGS. 2A-2C depict alternative process steps, as compared to process steps shown in FIGS. 1B and 1C, of the formation of a graphene-based field effect transistor (FET) structure, which is fabricated and structured according to an embodiment of the present invention.
Figure 2B:
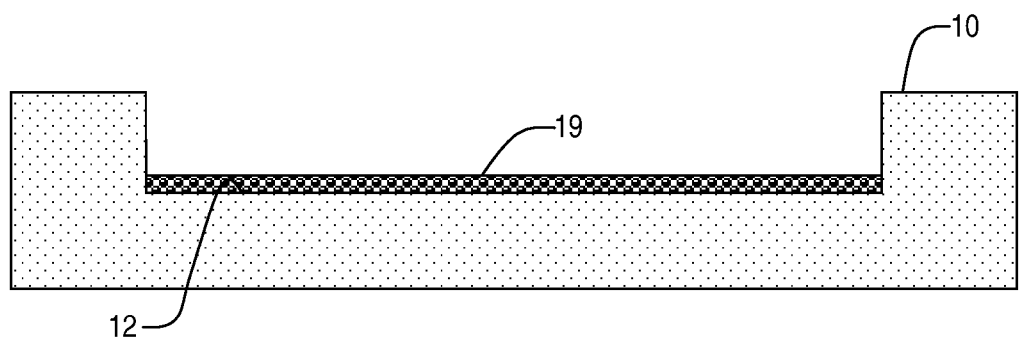
Figure 2C:
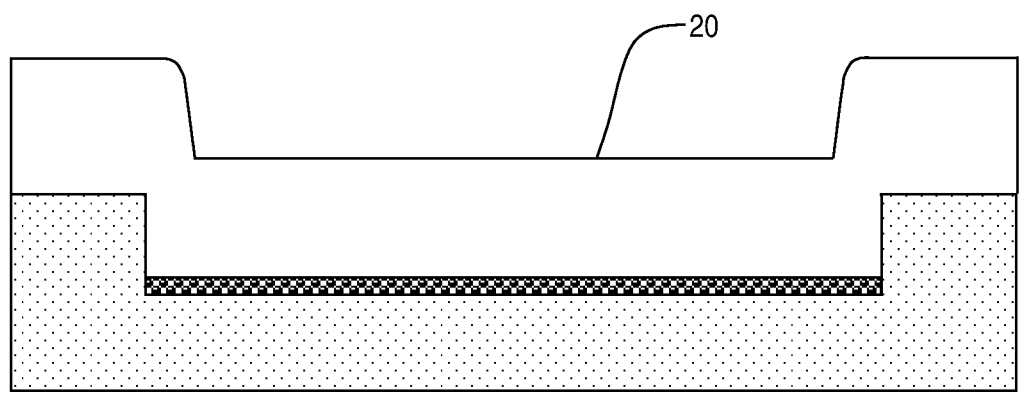

Also, in the process step depicted in FIG. 1B, the growth of graphene can be performed with methods other than thermal decomposition of an SiC substrate. As shown in FIGS. 2A-2C, one variation of such an implementation is to deposit a carbon-containing layer, such as an SiC thin film, grown on a substrate, such as Si, rather than using a substrate formed of SiC. Thus, for example, the substrate 10 can be formed of a commonly used substrate material (e.g., Si) and the trench 12 can be formed in the substrate 10 (e.g., in the manner shown in FIG. 1A), and then a thin film of SiC 11 can be grown within the trench 12 as shown in FIG. 2A. Then, the thin SiC film can be thermally decomposed to form the graphene layer 19 within the trench 12 as shown in FIG. 2B. Dielectric layer 20 is then deposited to cover the graphene layer 19, as shown in FIG. 2C. And then, a CMP is performed to polish the upper surface of the device structure, thus removing the dielectric material outside of the trench 12, thereby resulting in the structure similar to that shown in FIG. 1D, which can then be further processed to form a structure similar to that shown in FIG. 1E. Such a process can be used to achieve large scale integrated circuits built on or integrated with Si.

FIGS. 3A-3D depict a process of formation of a graphene-based field effect transistor (FET) structure, which is fabricated and structured according to another embodiment. In this embodiment, the pre-patterning process used to form the trench is altered. More specifically, in this embodiment, the trench is not etched into the substrate, but is still used to define the graphene-based device structures.

Figure 3A:
FIGS. 3A-3D depict a process of formation of a graphene-based field effect transistor (FET) structure, which is fabricated and structured according to another embodiment of the present invention.

In the process step shown in FIG. 3A, an insulator 32 (e.g. $SiO_2$) is deposited on a substrate material containing carbon or graphene precursor 30 (e.g., SiC).

Figure 3B:
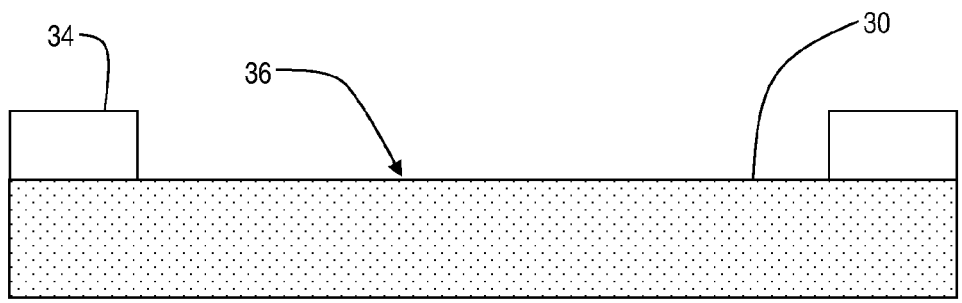

In the process step shown in FIG. 3B, a trench 36 is etched by etching through the insulator 32 to expose the area of the graphene precursor 30 where the graphene devices are to be formed. Thus, remaining portions 34 of the insulator define the trench 36. The shape and dimensions (i.e., depths, widths, lengths) of the trench is determined based upon the device structures being formed within the trench.

Figure 3C:
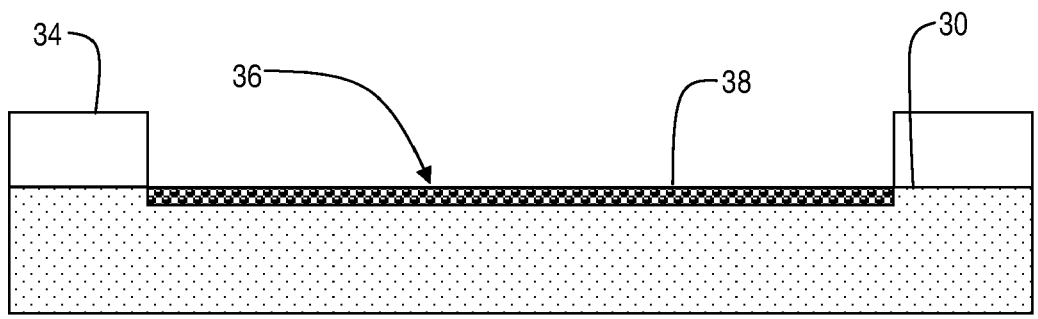

In the process step shown in FIG. 3C, a graphene layer 38 grown by thermal decomposition of the exposed graphene precursor 30. Thus, the graphene layer 38 is formed on a bottom surface of the trench 36.

Figure 3D:
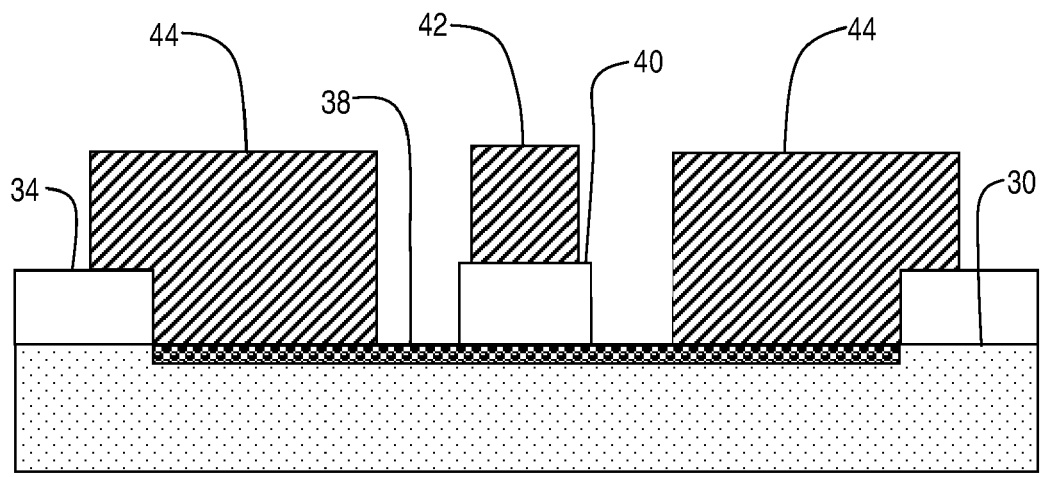

In the process step shown in FIG. 3D, a dielectric material (e.g., a high-k insulator) is deposited and patterned to form gate dielectric 40. Also, a metal contact 42 for a gate is deposited and patterned thereon within the trench 36. Additionally, metal contacts 44 for source and drains regions are deposited and patterned on the graphene layer 38 within the trench 36. Thus, source/drain metal contacts and a gate metal contact are formed upon the graphene layer 38 within the trench 36 to form a graphene-based device structure, which in this instance is a graphene-based FET. A protective insulator cap can be deposited to cover and protect the entire device structure.

As an alternative to the process steps shown in FIGS. 3A-3C, the growth of graphene can be performed with methods other than thermal decomposition of an SiC substrate. For example, the substrate 30 can be formed of a material such as Si (rather than of a graphene precursor material) to have the structure shown in FIG. 3B, then a graphene precursor layer can be formed in the trench in a manner similar to that depicted in FIG. 2A, and then the graphene precursor layer can be thermally decomposed to form the graphene layer in the trench in a manner similar to that depicted in FIG. 2B.

Figure 4A:
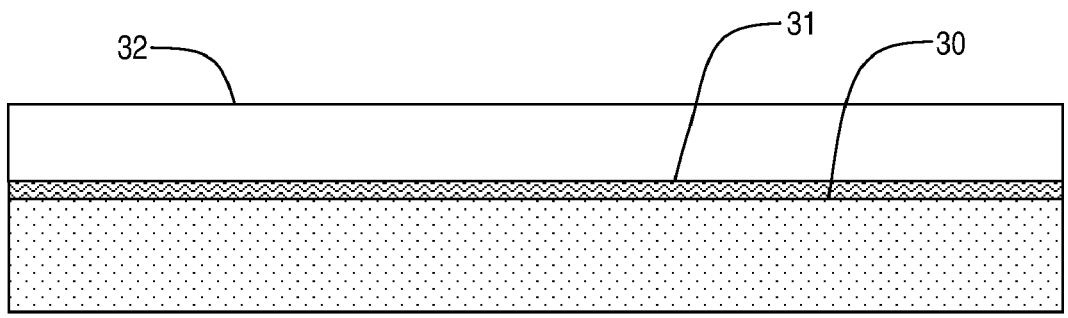
FIGS. 4A-4C depict alternative process steps, as compared to process steps shown in FIGS. 3A-3C, of the formation of a graphene-based field effect transistor (FET) structure, which is fabricated and structured according to another embodiment of the present invention.
Figure 4B:
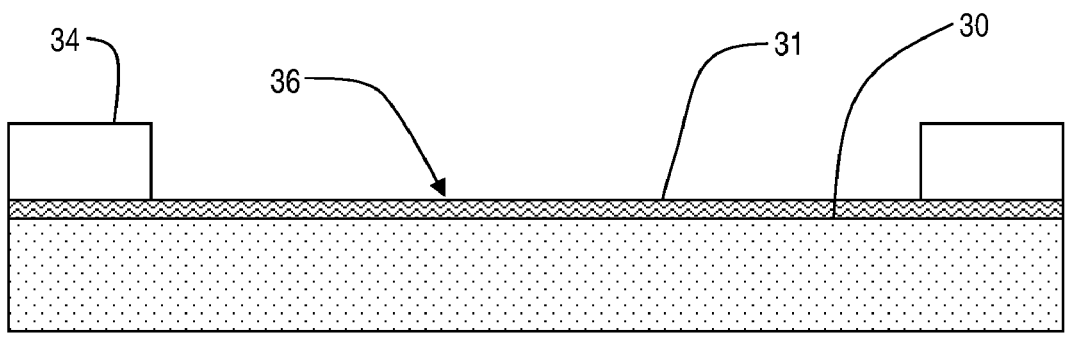
Figure 4C:
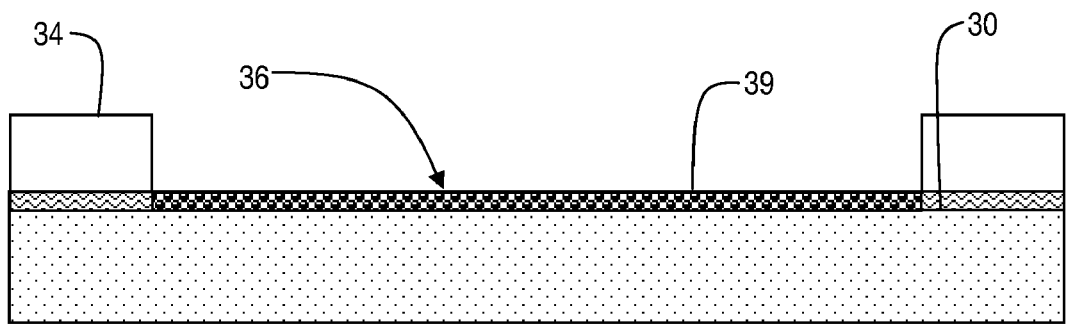
Figure 5:
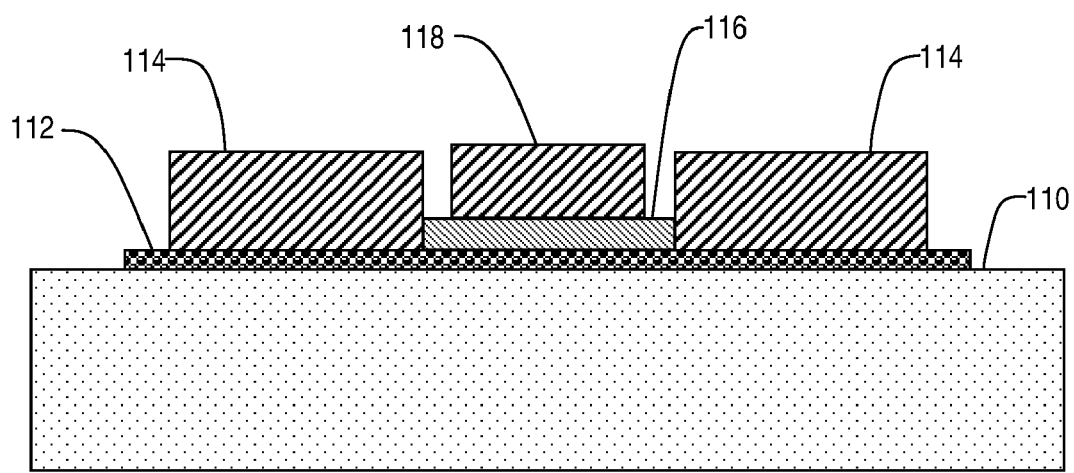
FIG. 5 depicts a graphene-based field effect transistor (FET) structure, which is fabricated and structured according to a related art process.

As depicted in FIGS. 4A-4C, another variation of such an implementation is to start with a layer of carbon-containing material, such as an SiC thin film, 31 grown on a substrate 30, which can be Si, rather than using a substrate formed of SiC. The thin film graphene precursor 31 is thus sandwiched between the substrate 30 and the insulator 32. Thus, for example, the substrate 30 can be formed of Si, then a thin film 31 of a graphene precursor such as SiC can be formed on top of the substrate 30, and then an insulator (e.g. $SiO_2$) 32 can be deposited on top of the thin film of graphene precursor resulting in the structure depicted in FIG. 4A. Then, as shown in FIG. 4B, the trench 36 can be etched by etching through the insulator to expose an area of the thin film of graphene precursor, which is where the graphene devices are to be formed. Then, the exposed portion of the thin film 31 is thermally decomposed to form a graphene layer 39 as shown in FIG. 4C. And then, the structure is further processed to form a structure similar to that shown in FIG. 3D. Such a process can be used to achieve large scale integrated circuits built on or integrated with Si.

As noted above, the processes disclosed herein can be used on a variety of device structures, such as a graphene-based P-N junction. In such a configuration, the gates and metal contacts, as well as dielectrics therebetween, can all be patterned upon the graphene layer within the trench, for example, using the structures shown in FIGS. 1D, 3C, and 4C. In operation, opposite voltages are applied to the gates of the P-N junction using respective contacts thereof, thereby introducing n-type and p-type conduction regions in the graphene layer from an ambipolar field effect. In other words, the graphene is electrically doped to n-type and p-type by the two gate voltages, and conduction between the two end contacts will pass through the graphene-based P-N junction.

The processes for fabricating graphene devices disclosed herein are advantageous in that the processes are simpler than other processes of forming graphene devices, since the processes disclosed herein do not require etching of graphene. The shape and dimension of the graphene layer can be accurately controlled by the process of the trench structure. Additionally, the processes disclosed herein advantageously provide processes that can utilize existing patterning technologies in CMOS for extremely small feature size. The process also provides good bonding of the graphene layer on the substrate.

It should be noted that the exemplary embodiments depicted and described herein set forth the preferred embodiments of the present invention, and are not meant to limit the scope of the claims hereto in any way. Numerous modifications and variations of the present invention are possible in light of the above teachings. It is therefore to be understood that, within the scope of the appended claims, the invention may be practiced otherwise than as specifically described herein.

What is claimed is:

1. A process comprising:
   forming a trench defined by one or more layers of material;
   forming a graphene layer within the trench; and
   forming a device structure on the graphene layer and within the trench.

2. The process according to claim 1, comprising forming the trench by etching the trench in a substrate, wherein the etched substrate defines the trench.

3. The process according to claim 2, comprising forming the graphene layer by thermal decomposition of the substrate, wherein the substrate is a carbon-containing material.

4. The process according to claim 2, comprising forming the graphene layer by depositing a carbon-containing material within the trench and performing thermal decomposition of the carbon-containing material within the trench.

5. The process according to claim 4, wherein the substrate is Si.

6. The process according to claim 1, comprising forming the trench by etching the trench through an insulator material formed on a substrate, wherein the etched insulator material and the substrate define the trench.

7. The process according to claim 6, comprising forming the graphene layer by thermal decomposition of the substrate, wherein the substrate is a carbon-containing material.

8. The process according to claim 6, comprising forming the graphene layer by depositing a carbon-containing material within the trench and performing thermal decomposition of the carbon-containing material within the trench.

9. The process according to claim 8, wherein the substrate is Si.

10. The process according to claim 1, comprising forming the trench by etching the trench through an insulator material formed on a carbon-containing material layer formed on a substrate, wherein the etched insulator material and the substrate define the trench, and comprising forming the graphene layer by thermal decomposition of the carbon-containing material layer exposed by etching of the insulator material to form trench.

11. The process according to claim 1, comprising forming the graphene layer by depositing a carbon-containing material within the trench and performing thermal decomposition of the carbon-containing material within the trench.

12. The process according to claim 1, comprising forming of the graphene layer within the trench without etching of the graphene layer, and comprising forming the device structure on the graphene layer within the trench without etching of the graphene layer.

13. The process according to claim 1, wherein the device structure is a field effect transistor or a p-n junction.

14. The process according to claim 1, comprising forming the device structure by using the trench to define size and shape of the device structure.

15. A graphene-based device comprising:
    a trench formed in one or more layers of material;
    a graphene layer formed within said trench; and
    a device structure formed on said graphene layer and within said trench.

16. The device according to claim 15, wherein said one or more layers of material includes a substrate, and wherein said trench is etched within said substrate.

17. The device according to claim 16, wherein said substrate is a carbon-containing material.

18. The device according to claim 15, wherein said one or more layers of material includes an insulator material and a substrate, wherein said trench is etched through said insulator material formed on said substrate, and wherein said trench is defined by said etched insulator material and said substrate.

19. The device according to claim 18, wherein said substrate is a carbon-containing material.

20. The device according to claim 15, wherein said device structure is a field effect transistor or a p-n junction.

* * * * *